(12) United States Patent
Kim

(10) Patent No.: US 9,288,936 B2
(45) Date of Patent: Mar. 15, 2016

(54) SHIELD CASE AND ANTENNA SET COMPRISING IT

(75) Inventor: Jongguk Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 833 days.

(21) Appl. No.: 13/380,748

(22) PCT Filed: Jun. 25, 2010

(86) PCT No.: PCT/KR2010/004161
§ 371 (c)(1),
(2), (4) Date: Apr. 18, 2012

(87) PCT Pub. No.: WO2010/151088
PCT Pub. Date: Dec. 29, 2010

(65) Prior Publication Data
US 2012/0194402 A1    Aug. 2, 2012

(30) Foreign Application Priority Data

Jun. 26, 2009  (KR) .................. 10-2009-0057587

(51) Int. Cl.
| | |
|---|---|
| *H01Q 1/52* | (2006.01) |
| *H05K 9/00* | (2006.01) |
| *H01Q 1/24* | (2006.01) |
| *H01Q 1/44* | (2006.01) |
| *H01Q 1/50* | (2006.01) |
| *H01Q 21/28* | (2006.01) |

(52) U.S. Cl.
CPC ............ *H05K 9/0026* (2013.01); *H01Q 1/243* (2013.01); *H01Q 1/44* (2013.01); *H01Q 1/50* (2013.01); *H01Q 1/52* (2013.01); *H01Q 1/526* (2013.01); *H01Q 21/28* (2013.01)

(58) Field of Classification Search
USPC .................................. 343/841, 702
See application file for complete search history.

(56) References Cited

U.S. PATENT DOCUMENTS

| | | | | |
|---|---|---|---|---|
| 5,821,903 A | * | 10/1998 | Williams | H01Q 1/22 343/700 MS |
| 6,204,825 B1 | * | 3/2001 | Wilz | H01Q 1/52 343/702 |
| 2007/0188384 A1 | * | 8/2007 | Liu | H01Q 1/526 343/700 MS |

FOREIGN PATENT DOCUMENTS

| | | |
|---|---|---|
| EP | 0712212 A2 | 5/1996 |
| JP | 2002-299946 A | 10/2002 |
| JP | 2003-270325 A | 9/2003 |
| JP | 2004-242034 A | 8/2004 |
| JP | 2005-507185 A | 3/2005 |
| KR | 10-2005-0012971 A | 2/2005 |
| KR | 10-0803348 B1 | 2/2008 |
| WO | WO 03/007418 A2 | 1/2003 |

* cited by examiner

*Primary Examiner* — Hoang V Nguyen
*Assistant Examiner* — Hai Tran
(74) *Attorney, Agent, or Firm* — Birch, Stewart, Kolasch & Birch, LLP

(57) ABSTRACT

The present invention relates to a shield case and an antenna set comprising the same, wherein the shield case includes a shield surface for shielding embedded electronic elements against electromagnetic wave, a fixing unit coupled with a substrate mounted with the electronic elements, signal receivers for receiving a signal of desired frequency, and two strip antennas connected to a border of the shield surface, each antenna facing the other across the shield surface.

11 Claims, 4 Drawing Sheets

SHIELD CASE AND ANTENNA SET COMPRISING IT

TECHNICAL FIELD

The present invention relates to a shield case formed with a strip antenna and an antenna set comprising the same.

BACKGROUND ART

A radio communication apparatus using for reception of a signal of gigahertz band can receive a radio signal of a desired band by using a strip antenna or a chip antenna.

Recently, a radio communication terminal is required to be formed with two antennas in a terminal. There may be two purposes for using two antennas. That is, firstly, the terminal is mounted with two antennas for overseas roaming, or for commonly using two radio communication service providers each having a different reception frequency, and secondly, the terminal is mounted with two antennas for receiving radio signals each having a same frequency, where one antenna is used for transmission of signals, while the other antenna is used for reception of signals.

The latter aspect may be exemplified in a terminal for radio Internet service (e.g., Wibro). However, concomitant with miniaturization and multi-functionalization of a radio communication terminal, it is difficult to obtain a space to accommodate two or more antennas, and mounting of two or more antennas becomes a factor that increases the manufacturing cost.

Meanwhile, the radio communication terminal is mounted therein with many electronic elements, and parts of the elements are adversely affected by outside electromagnetic waves, such that the radio communication terminal may be formed with a shield case for blocking the electronic elements from the electromagnetic waves.

DISCLOSURE OF INVENTION

Technical Problem

The present invention is disclosed to provide a shield case configured to provide two or more antennas with an inexpensive cost and an antenna set comprising it. The present invention is also disclosed to provide a shield case configured to provide two or more antennas with a reduced space and an antenna set comprising it.

Technical problems to be solved by the present invention are not restricted to the above-mentioned, and any other technical problems not mentioned so far will be clearly appreciated from the following description by skilled in the art.

Solution to Problem

An object of the invention is to solve at least one or more of the above problems and/or disadvantages in a whole or in part and to provide at least the advantages described hereinafter. In order to achieve at least the above objects, in whole or in part, and in accordance with the purposes of the invention, as embodied and broadly described, and in one general aspect of the present invention, there is provided a shield case, comprising: a shield surface for shielding embedded electronic elements against electromagnetic wave; a fixing unit coupled with a substrate mounted with the electronic elements; signal receivers for receiving a signal of desired frequency; and two strip antennas connected to a border of the shield surface, each antenna facing the other across the shield surface.

In some exemplary embodiments of the present invention, the signal receivers may be formed with a strip-shaped flat surface of conductive material, and the fixing unit is a protruder that is partially protruded from a side of the strip-shaped flat surface.

In some exemplary embodiments of the present invention, the strip-shaped flat surface may be perpendicularly formed to the shield surface.

In some exemplary embodiments of the present invention, the strip antenna may include a trimming unit partially or entirely removable in the trimming process.

In some exemplary embodiments of the present invention, the shield case may further include at least one fixing surface positioned at a border where the two strip antennas are not positioned for coupling the shield surface to the substrate.

In some exemplary embodiments of the present invention, the shield case may include two additional strip antennas connected to the border of the shield surface, and positioned at a border where the two strip antennas of the shield surface are not positioned, each of the two additional strip antennas facing the other across the shield surface.

In another general aspect of the present invention, there is provided an antenna set comprising a shield case, comprising: a substrate mounted with electronic elements; and a shield case including a shield surface for shielding the embedded electronic elements against electromagnetic wave, a fixing unit coupled with the substrate, a signal receiver for receiving a signal of a desired frequency and two strip antennas connected to a border of the shield surface, each facing the other across the shield surface.

In some exemplary embodiments of the present invention, the substrate may include two chip antennas positioned at a point not shielded by the shield case on the substrate.

In some exemplary embodiments of the present invention, each frequency of reception signals of the two strip antennas may be identical, each frequency of reception signals of the two chip antennas may be identical, and each frequency of reception signals from the strip antenna and the chip antenna may be different.

In some exemplary embodiments of the present invention, the signal receiver may be formed with a strip-shaped flat surface of conductive material, and the fixing unit may be a protruder that is partially protruded from a side of the strip-shaped flat surface.

In some exemplary embodiments of the present invention, the strip antenna may include a trimming unit partially or entirely removable in the trimming process.

In some exemplary embodiments of the present invention, the antenna set may include at least one fixing surface positioned at a border where the two strip antennas are not positioned for coupling the shield surface to the substrate.

Advantageous Effects of Invention

The shield case formed with a strip antenna and an antenna set comprising the same according to the present invention have advantageous effects in that manufacturing cost can be reduced, and a space of the product can be reduced.

MODE FOR THE INVENTION

Figure 1:
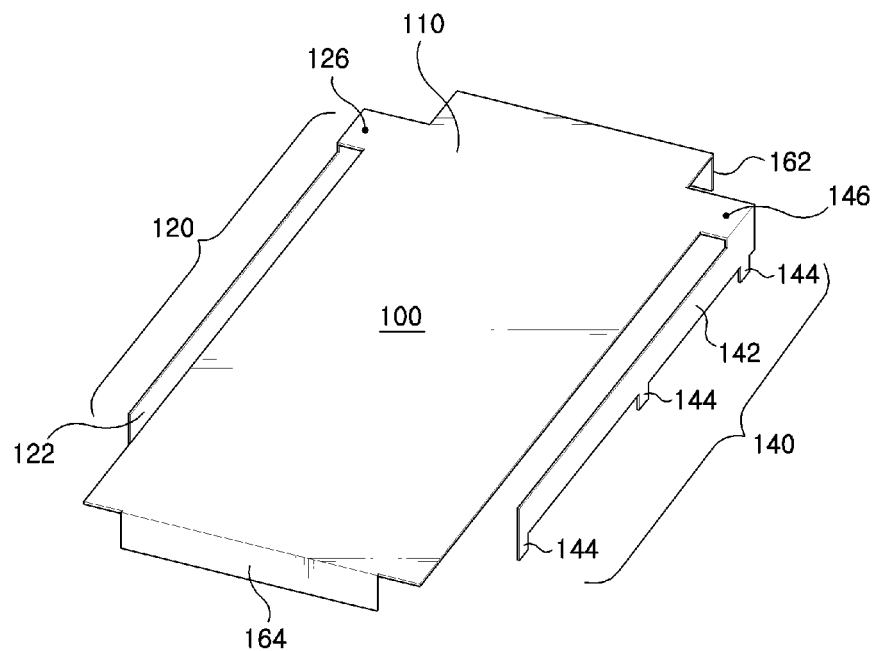
FIG. 1 is a perspective view illustrating a shield case formed with two strip antennas according to an exemplary embodiment of the present invention.

Exemplary embodiments of the present invention will be described in detail with reference to the accompanying drawings. Like reference numerals refer to like parts or portions throughout the description of several views of the drawings. Detailed descriptions of well-known functions, configurations or constructions are omitted for brevity and clarity so as not to obscure the description of the present invention with unnecessary detail.

FIG. 1 is a perspective view illustrating a shield case formed with two strip antennas according to an exemplary embodiment of the present invention.

A shield case (100) according to FIG. 1 may include a shield surface (110) for shielding embedded electronic elements (parts) against electromagnetic wave; a fixing unit (144) coupled with a substrate mounted with the electronic elements; signal receivers (122, 142) for receiving a signal of desired frequency; and two strip antennas (120, 140) connected to a border of the shield surface (110), each antenna facing the other across the shield surface (110) on an axially symmetrical base.

The signal receivers (122, 142) may be formed with a strip-shaped flat surface of conductive material, and the fixing unit (144) may be a protruder that is partially protruded from a side (i.e., the signal receiver 142) of the strip-shaped flat surface. Although concealed in the perspective view of FIG. 1, a fixing unit that is partially protruded downward from the signal receiver (122) is also formed at the antenna (120).

The shield case (100) may further include two fixing surfaces (162, 164) positioned at a border where the two strip antennas (120, 140) are not positioned for coupling the shield surface to the substrate, whereby coupling with the substrate of the shield case can be stabilized. The shield surface (110) and the two strip antennas (120, 140) may be integrally manufactured in a plate of same conductive material, thereby increasing the effect of reducing the manufacturing cost. Furthermore, the two fixing surfaces (162, 164) may be integrally manufactured with the shield surface (110).

The shield surface (110) may be perpendicularly formed with the signal receivers (122, 142) of the two strip antennas (120, 140), and the shield surface (110) and the two fixing surfaces (162, 164) are also perpendicularly formed to allow the shield surface (110), the two strip antennas (120, 140) and the two fixing surfaces (162, 164) to form a rectangular parallelepiped. The electronic elements mounted on the substrate coupled to the shield case may be positioned in a space formed inside the rectangular parallelepiped.

Feeding points (126, 146) for each strip antenna may be formed at a connection point where each strip antenna and the shield surface (100) are connected.

The two strip antennas (120, 140), being made of same dimensions, may transmit or receive a signal having a same frequency band. For example, the two strip antennas (120, 140) may be formed with antennas for Wibro wireless LAN using the same 2.3 GHz signal, and one of the strip antennas (120) may be used for upload antenna while the other strip antenna (140) may be used for download.

Figure 2:
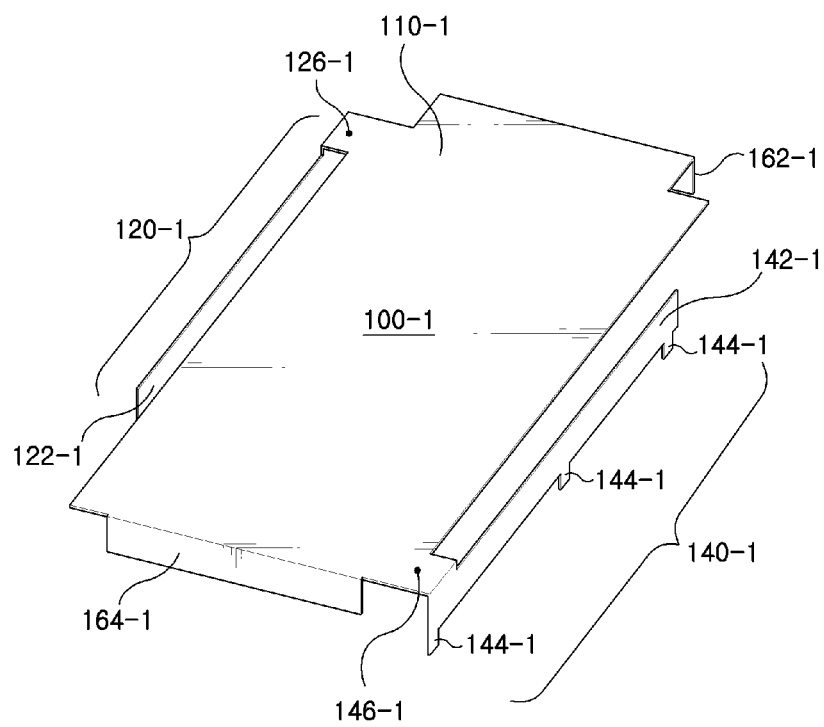
FIG. 2 is a perspective view illustrating a shield case formed with two strip antennas according to another exemplary embodiment of the present invention.

FIG. 2 is a perspective view illustrating a shield case formed with two strip antennas according to another exemplary embodiment of the present invention.

A shield case (100-1) according to FIG. 2 may include a shield surface (110-1) for shielding embedded electronic elements (parts) against electromagnetic wave; a fixing unit (144-1) coupled with a substrate mounted with the electronic elements; signal receivers (122-1, 142-1) for receiving a signal of desired frequency; and two strip antennas (120-1, 140-1) connected to a border of the shield surface (110-1), each antenna facing the other across the shield surface (110-1) on a point symmetry base.

Feeding points (126-1, 146-1) of the two strip antennas (120-1, 140-1) at the shield case (100-1) are positioned on a point symmetry base about the shield surface (110-1), such that a distance between two power supply points (126-1, 146-1) is longer than that of FIG. 1. As a result, mutual interference between the two strip antennas (120-1, 140-1) is advantageously reduced. Conversely, there is a disadvantage in that the connecting work of each feeding point (126-1, 146-1) on the substrate is cumbersome. Other configurations except for the point symmetrical structure of the shield case (100-1) are the same as those of FIG. 1, such that redundant explanation thereto will be omitted.

Figure 3:
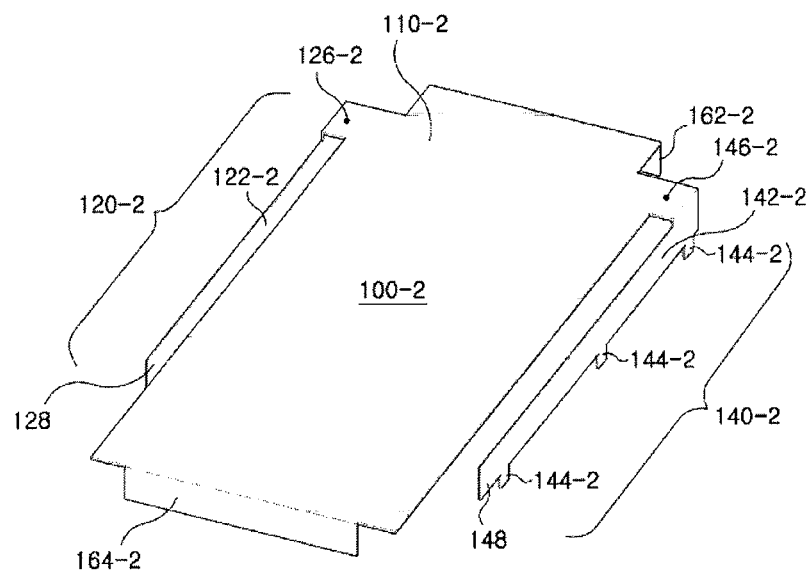
FIG. 3 is a perspective view illustrating a shield case formed with two strip antennas according to still another exemplary embodiment of the present invention.

FIG. 3 is a perspective view illustrating a shield case formed with two strip antennas according to still another exemplary embodiment of the present invention.

Structure of a shield case (100-2) according to FIG. 3 is similar to that of FIG. 1, except that each distal end of strip antennas (120-2, 140-2) is further formed with trimming units (128, 148) for trimming work. The trimming units (128, 148) are configurations for use in the radio communication services in which shield cases manufactured in the same process have various frequency bands. That is, length of the trimming units (128, 148) may be adjusted to cater to the frequency band according to purposes to be used after the shield case (100-2) is manufactured. The trimming unit (148) was formed at an outside of the fixing unit (144-2) to facilitate the length adjustment of the trimming units (128, 148). Another symmetrical strip antenna (120-2) may be applied in the same manner. The configuration of shield case (100-2) in FIG. 3 is similar to that of FIG. 1 except for the trimming units (128, 148), such that no redundant explanation will be given herein.

Figure 4:
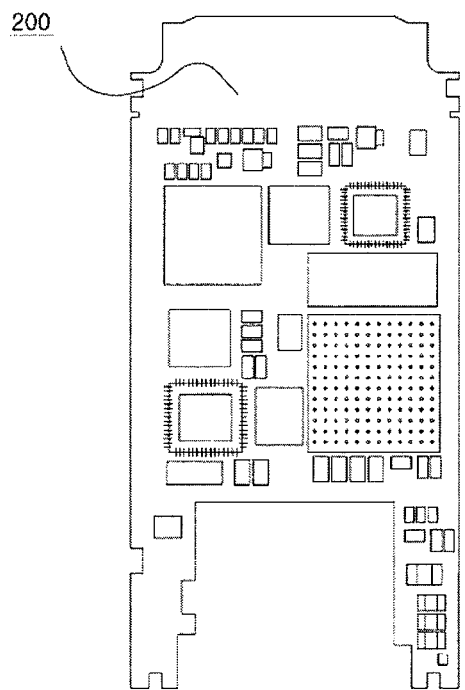
FIG. 4 is a plan view illustrating a substrate coupleable to a shield case of FIGS. 1 through 3 according to an exemplary embodiment of the present invention.

FIG. 4 is a plan view illustrating a substrate coupleable to a shield case of FIGS. 1 through 3 according to an exemplary embodiment of the present invention.

Referring to FIG. 4, a substrate (200) may be mounted thereon with a plurality of electronic elements, and coupled to the shield case of FIGS. 1 through 3 for blocking influences of electromagnetic wave against the electronic elements, whereby no separate antenna elements are needed to be installed due to two strip antennas formed at the shield case.

Figure 5:
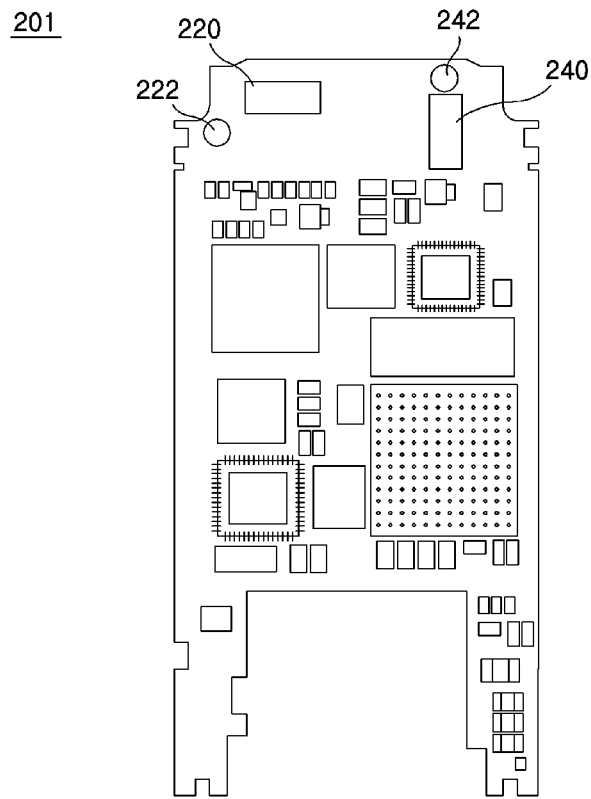
FIG. 5 is a plan view illustrating a substrate coupleable to a shield case of FIGS. 1 through 3 according to another exemplary embodiment of the present invention.

FIG. 5 is a plan view illustrating a substrate coupleable to a shield case of FIGS. 1 through 3 according to another exemplary embodiment of the present invention.

Referring to FIG. 5, a substrate (201) is formed thereon with a plurality of electronic elements and mounted with two chip antennas (220, 240), where reference numerals 222, 242 indicate feeding points of each antenna (220, 240).

Figure 6:
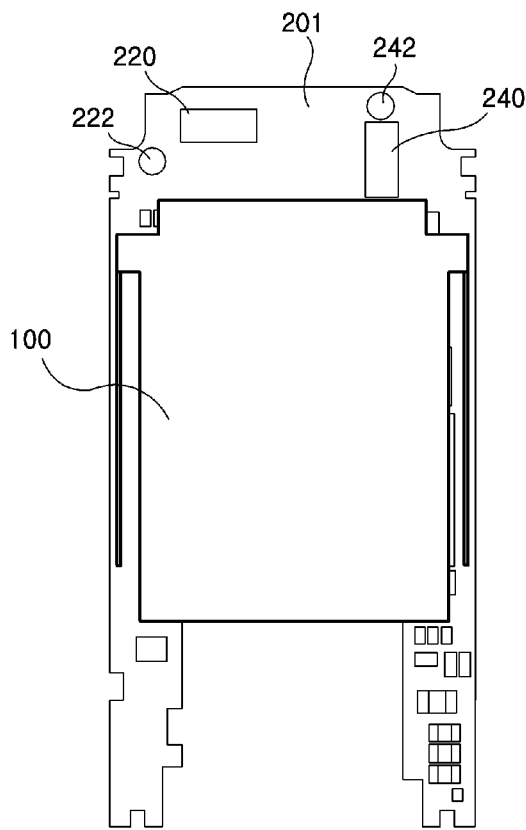
FIG. 6 is a plan view illustrating an antenna set in which the substrate of FIG. 5 is coupled to the shield case of FIG. 1.

FIG. 6 is a plan view illustrating an antenna set in which the substrate (201) of FIG. 5 is coupled to the shield case of FIG. 1.

That is, the illustrated antenna set may include a substrate (201) mounted with electronic elements and formed with two chip antennas (220, 240) positioned at a point not shielded by the shield case; a shield surface for shielding the embedded electronic elements against electromagnetic wave; a fixing unit coupled to the substrate; signal receivers for receiving a signal of a desired frequency; and a shield case (100) connected to a border of the shield surface and including two strip antennas at a position where each of the chip antennas face the other across the shield surface.

The illustrated two chip antennas (220, 240) may be positioned outside of the shield case so as to prevent radio signals from being shielded by the shield case. The two strip antennas and the two chip antennas (220, 240) formed at the shield case may be implemented in such a way as to receive signals of different frequency bands, or the frequency bands of reception signals of two strip antennas may be identical while the frequency bands of reception signals of the two chip antennas may be mutually identical. At this time, the frequencies of reception signals of the strip antennas and the chip antennas are mutually different.

For example, the two strip antennas may transmit or receive upload signals and download signals for Korean Wibro radio Internet of 2.3 GHz frequency band, while the two chip antennas may transmit or receive upload signals and download signals for radio Internet of other countries in 2.5 GHz frequency band. It should be apparent that the shield case of FIG. 2 or FIG. 3 may be used over the shield case (100) of FIG. 6.

Figure 7:
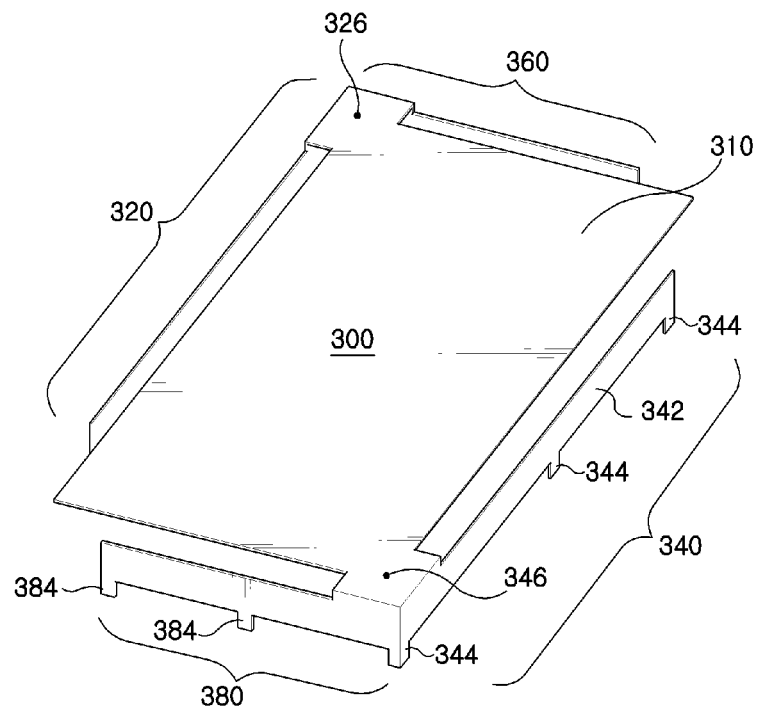
FIG. 7 is a perspective view illustrating a shield case formed with four strip antennas according to another exemplary embodiment of the present invention.

FIG. 7 is a perspective view illustrating a shield case formed with four strip antennas according to another exemplary embodiment of the present invention.

Referring to FIG. 7, a shield case (300) may include a shield surface (310) for shielding embedded electronic elements (parts) against electromagnetic wave; a fixing unit (344) coupled with a substrate mounted with the electronic elements; a signal receiver (342) for receiving a signal of desired frequency; a first strip antenna (320) and a second strip antenna (340), each antenna facing the other across the shield surface (310) on a point symmetrical base, and a third strip antenna (360) and a fourth strip antenna (380) connected to a border of the shield surface (310), positioned at a border where the first/second strip antennas (320, 340) are not positioned, each antenna facing the other across the shield surface (310) on a point symmetrical base.

The frequency band of reception signals of the first/second strip antennas (320, 340) may be identically embodied, and the frequency band of reception signals of the third/fourth strip antennas (360, 380) may be identically embodied. At this time, the frequencies of the first/second strip antennas (320, 340) and those of the third/fourth strip antennas (360, 380) may be different, where a feeding point (326) may perform the feeding for the first/third strip antennas (320, 360), while a feeding point (346) may perform the feeding for the second/fourth strip antennas (340, 380).

For example, the first/second strip antennas (320, 340) may transmit or receive upload signals and download signals for Korean Wibro radio Internet of 2.3 GHz frequency band, while the third/fourth chip antennas (360, 380) may transmit or receive upload signals and download signals for radio Internet of other countries in 2.5 GHz frequency band. This type of configuration is to satisfy the condition where the feeding points of two antennas simultaneously using the same frequency band must be distanced from each other. The shield case (300) of FIG. 7 is similar to that of FIG. 2 except for the third/fourth strip antennas (360, 380), such that no redundant description thereto will be given.

Figure 8:
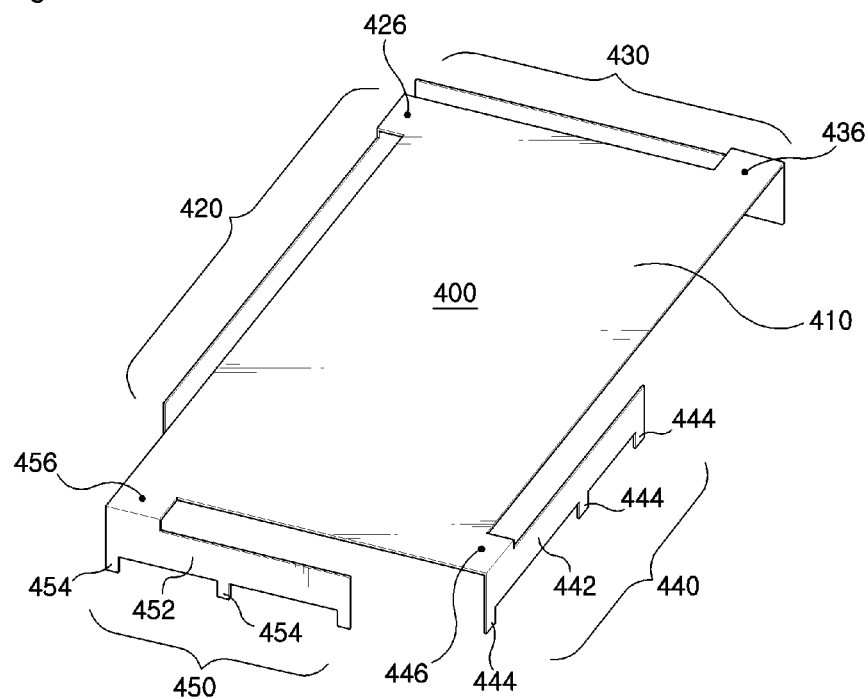
FIG. 8 is a perspective view illustrating a shield case formed with four strip antennas according to still another exemplary embodiment of the present invention.

FIG. 8 is a perspective view illustrating a shield case formed with four strip antennas according to still another exemplary embodiment of the present invention.

Referring to FIG. 8, a shield case (400) may include a shield surface (410) for shielding embedded electronic elements (parts) against electromagnetic wave; a fixing unit (444) coupled to a substrate mounted with the electronic elements; a signal receiver (442) for receiving a signal of desired frequency; a first strip antenna (420) and a second strip antenna (440) connected to a border of the shield surface (410), each antenna facing the other across the shield surface (410) on a point symmetrical base, and a third strip antenna (430) and a fourth strip antenna (450) connected to a border of the shield surface (410), positioned at a border where the first/second strip antennas (420, 440) are not positioned, each antenna facing the other across the shield surface (410) on a point symmetrical base.

It should be noted that feeding points (426, 436, 446, 456) of the four strip antennas (420, 430, 440, 450) in the shield case (400) of FIG. 8 are differently positioned from those of FIG. 7. Although it is more difficult to manufacture the structure of FIG. 8 than that of FIG. 7, there is an advantage in that the used antennas have the freedom of disposition. For example, the frequency bands of reception signals in the first/third strip antennas (420, 430) may be configured to be identical, and the frequency bands of reception signals in the second/fourth strip antennas (440, 450) may be configured to be identical. The shield case (400) of FIG. 8 is similar to that of FIG. 2 except for the third/fourth strip antennas (430, 450), such that no redundant description thereto will be given.

Although the present invention has been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A shield case comprising:
a shield surface configured to shield electronic components which are disposed on a substrate;
a first antenna portion extended from a first corner of the shield surface; and
a second antenna portion extended from a second corner of the shield surface,
wherein each of the first and second antenna portions is positioned perpendicular to the shield surface,
wherein the first and second antenna portions face each other, and
wherein a first feeding point is disposed on a first connection portion where the shield surface and the first antenna portion are connected, and a second feeding point is disposed on a second connection portion where the shield surface and the second antenna portion are connected.

2. The shield case of claim 1, wherein a length of the first antenna portion corresponds to a length of the second antenna portion.

3. The shield case of claim 1, wherein a length of the first antenna portion is different from a length of the second antenna portion.

4. The shield case of claim 1, wherein a trimming portion extends from an end of each of the first and second antenna portions, respectively.

5. The shield case of claim 4, wherein a length of the trimming portion is adjustable.

6. The shield case of claim 1, further comprising:
a first fixing surface extended from a first edge of the shield surface and configured to be fixed to the substrate; and
a second fixing surface extended from a second edge of the shield surface and configured to be fixed to the substrate,
wherein each of the first and second fixing surfaces is perpendicular to the shield surface, and
wherein the first and second fixing surfaces face each other.

7. The shield case of claim 1, further comprising:
a third antenna portion extended from the first corner of the shield surface; and
a fourth antenna portion extended from the second corner of the shield surface,
wherein each of the third and fourth antenna portions is positioned perpendicular to the shield surface, and
wherein the third and fourth antenna portions face each other.

8. The shield case of claim 7, wherein a length of the first antenna corresponds to a length of the second antenna, and
wherein a length of the third antenna corresponds to a length of the fourth antenna.

9. The shield case of claim 7, wherein a third feeding point is disposed on a third connection portion where the shield surface and the third antenna portion are connected, and
wherein a fourth feeding point is disposed on a fourth connection portion where the shield surface and the fourth antenna portion are connected.

10. The shield case of claim 1, further comprising:
a third antenna portion extended from the first corner of the shield surface; and
a fourth antenna portion extended from the second corner of the shield surface,
wherein each of the third and fourth antenna portions is positioned perpendicular to the shield surface, wherein the third and fourth antenna portions face each other,
wherein the third antenna portion is fed from the first feeding point, and
wherein the fourth antenna portion is fed from the second feeding point.

11. The shield case of claim 1, wherein the shield surface is planar, and
wherein each of the first and second antenna portions is connected to an edge of the planar shield surface by a fold line.

* * * * *